United States Patent
Liu

(12) United States Patent      (10) Patent No.: US 7,002,422 B1
                                                           (45) Date of Patent:      Feb. 21, 2006

(54) CURRENT-MIRRORED CRYSTAL-OSCILLATOR CIRCUIT WITHOUT FEEDBACK TO REDUCE POWER CONSUMPTION

(75) Inventor: Wing Faat Liu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 131 days.

(21) Appl. No.: 10/708,939

(22) Filed: Apr. 1, 2004

(51) Int. Cl.
    *H03B 5/32*      (2006.01)

(52) U.S. Cl. ............................... 331/158; 331/116 FE; 331/116 R

(58) Field of Classification Search ................ 331/158, 331/116 FE, 116 R
See application file for complete search history.

(56) References Cited

U.S. PATENT DOCUMENTS

| | | | |
|---|---|---|---|
| 4,520,326 A | 5/1985 | Clemens | ................. 331/116 R |
| 5,113,153 A | 5/1992 | Soyuer | ......................... 331/61 |
| 5,606,295 A | 2/1997 | Ohara et al. | ........... 331/116 FE |
| 5,650,746 A | 7/1997 | Soltau | ......................... 327/524 |
| 5,914,643 A | 6/1999 | Tinsley et al. | ......... 331/116 FE |
| 6,028,491 A | 2/2000 | Stanchak et al. | ............. 331/75 |
| 6,313,712 B1 | 11/2001 | Mourant et al. | ....... 331/116 FE |
| 6,509,796 B1 | 1/2003 | Nguyen et al. | ............. 330/254 |
| 6,529,058 B1 | 3/2003 | Gupta | ......................... 327/276 |
| 6,542,042 B1 | 4/2003 | Atkinson | ................. 331/116 R |
| 6,727,769 B1 * | 4/2004 | Aihara et al. | ................ 331/158 |
| 6,791,428 B1 * | 9/2004 | Senthilkumar et al. | ..... 331/158 |

* cited by examiner

*Primary Examiner*—Arnold Kinkead
(74) *Attorney, Agent, or Firm*—Stuart T. Auvinen

(57) ABSTRACT

An oscillator inverter circuit has an input at a first crystal node and drives a second crystal node of a crystal oscillator. The first node is lightly loaded by a gate of an input transistor that generates a buffered node. The buffered node voltage is converted to a varying current by a converter transistor. Another varying current through upper and lower amplifier transistors are mirrored to upper and lower current mirror transistors. The gate and drain of the lower current mirror transistor are connected to the gate of an output transistor that pulls down the second node with low impedance. The drain of the upper current mirror transistor diverts current from an output current source, changing pull-up current to the second node through a p-channel transistor. An input resistor between the first node and the buffered node provides a DC bias but blocks AC oscillation signals.

20 Claims, 3 Drawing Sheets

CURRENT-MIRRORED CRYSTAL-OSCILLATOR CIRCUIT WITHOUT FEEDBACK TO REDUCE POWER CONSUMPTION

BACKGROUND OF INVENTION

This invention relates to crystal-oscillator circuits, and more particularly to oscillator buffers using current-mirror circuits without feedback.

Electronic systems and devices often must rely on precise clocks to sequence through states, process data, and perform other tasks. Crystal oscillators are often used to generate the precise clocks needed by these systems.

FIG. 1 is a diagram of a prior-art crystal oscillator. Crystal 12 oscillates at a fundamental frequency when a gain stage provides gain to start the crystal oscillating and then to maintain the oscillation. Crystal 12 is coupled between nodes X1 and X2, and is usually connected to other components such as inverter 14 by pins on an integrated circuit (IC). Inverter 14 inverts node X1 and drives node X2, acting as the gain stage and providing a 180-degree feedback signal to node X2 in relation to node X1. Feedback resistor 10 acts as a DC bias that biases inverter 14 in its gain region.

Capacitors 16, 18 provide a load capacitance to ground for nodes X1, X2. The value of capacitors 16, 18 can alter the frequency of oscillation of crystal 12. Any given crystal has a manufacturer-specified load capacitance that causes the crystal to oscillate at exactly the specified frequency. Larger capacitive loads on nodes X1, X2 slow down the oscillation, while smaller capacitive loads on nodes X1, X2 accelerate the oscillation.

The gain of inverter 14 must be large enough to provide a negative resistance to start oscillation. The negative resistance of inverter 14 is cancelled by the positive resistance of crystal 12, since the negative resistance provided by the inverter is equal to the series resistance of crystal. However as the amplitude of oscillations increase, the gain of inverter 14 is reduced by non-linearities of transistors in inverter 14.

The non-linearity of transistors in inverter 14 can distort the output waveform. Power loss and electro-magnetic interference (EMI) can increase. Higher-amplitude signals applied to crystal 12 can reduce its long-term stability. The gain of inverter 14 can vary with power-supply voltage Vdd, causing the oscillation frequency to vary with the power supply, which is undesirable.

DETAILED DESCRIPTION

The present invention relates to an improvement in crystal-oscillator circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
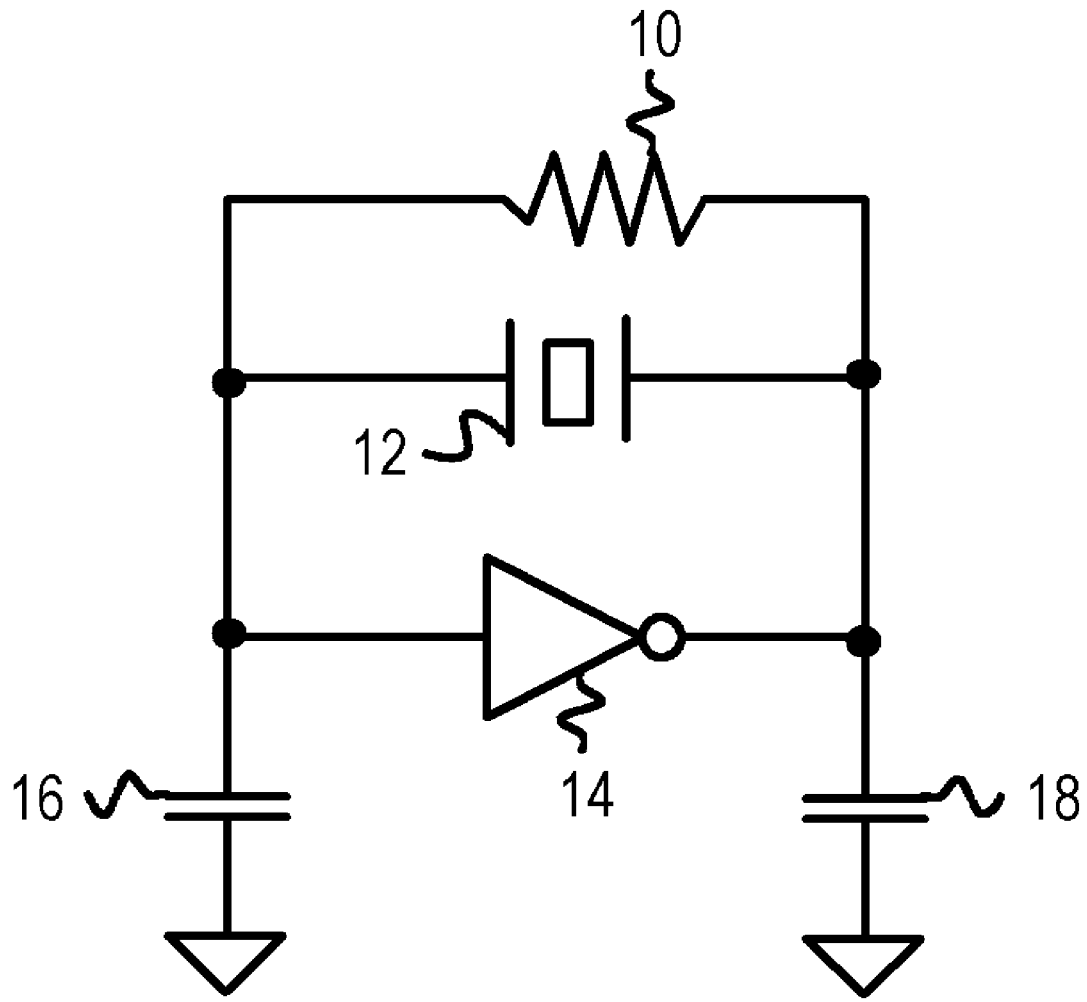
FIG. 1 is a diagram of a prior-art crystal oscillator.
Figure 2:
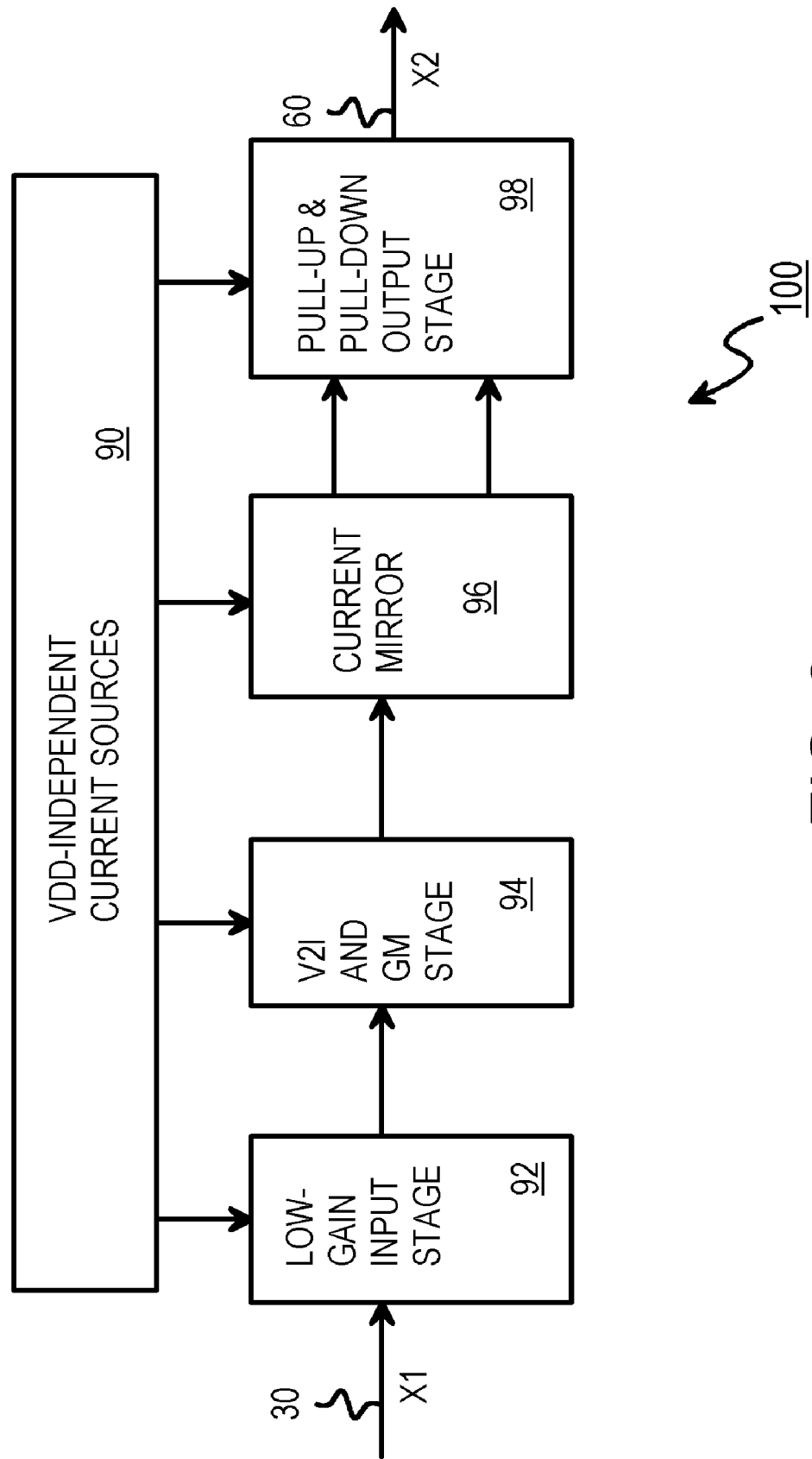
FIG. 2 is a block diagram of a current-mirrored inverter circuit for a crystal oscillator without feedback.

FIG. 2 is a block diagram of a current-mirrored inverter circuit for a crystal oscillator without feedback between stages. Circuit 100 can replace inverter 14 in the crystal oscillator of FIG. 1. The crystal and bias resistor (not shown) are connected between crystal nodes X1 and X2. Circuit-input node 30 is the first crystal node (X1), while circuit-output node 60 is the second crystal node (X2).

Low-gain input stage 92 receives first crystal node X1 as an input, and buffers node X1 to generate a buffered signal to gain stage 94. Low-gain input stage 92 also inverts the input signal in some embodiments. Low-gain input stage 92 reduces the loading on first crystal node X1, providing a clean signal on the crystal's nodes.

Gain stage 94 converts the buffered voltage signal from low-gain input stage 92 into a current (V2I conversion) and then provides current gain. Since low-gain input stage 92 buffers first crystal node X1 from gain stage 94, the crystal is not disturbed by the high-gain stage.

Current mirror 96 mirror the amplified current from gain stage 94 and drives a pull-up and a pull-down driver in output stage 98. High current drive to second crystal node X2 is provided by output stage 98.

Supply-independent current sources 90 provides current to each of low-gain input stage 92, gain stage 94, current mirror 96, and output stage 98. Noise on the power line is rejected by the supply-independent current sources.

In contrast to other circuits, no feedback is provided between stages of circuit 100. Instead, signals progressively are generated by subsequent blocks without inter-block feedback signals. Feedback circuits can have a stability problem and can cause noise peaks in the output signal if the damping factor is low.

Figure 3:
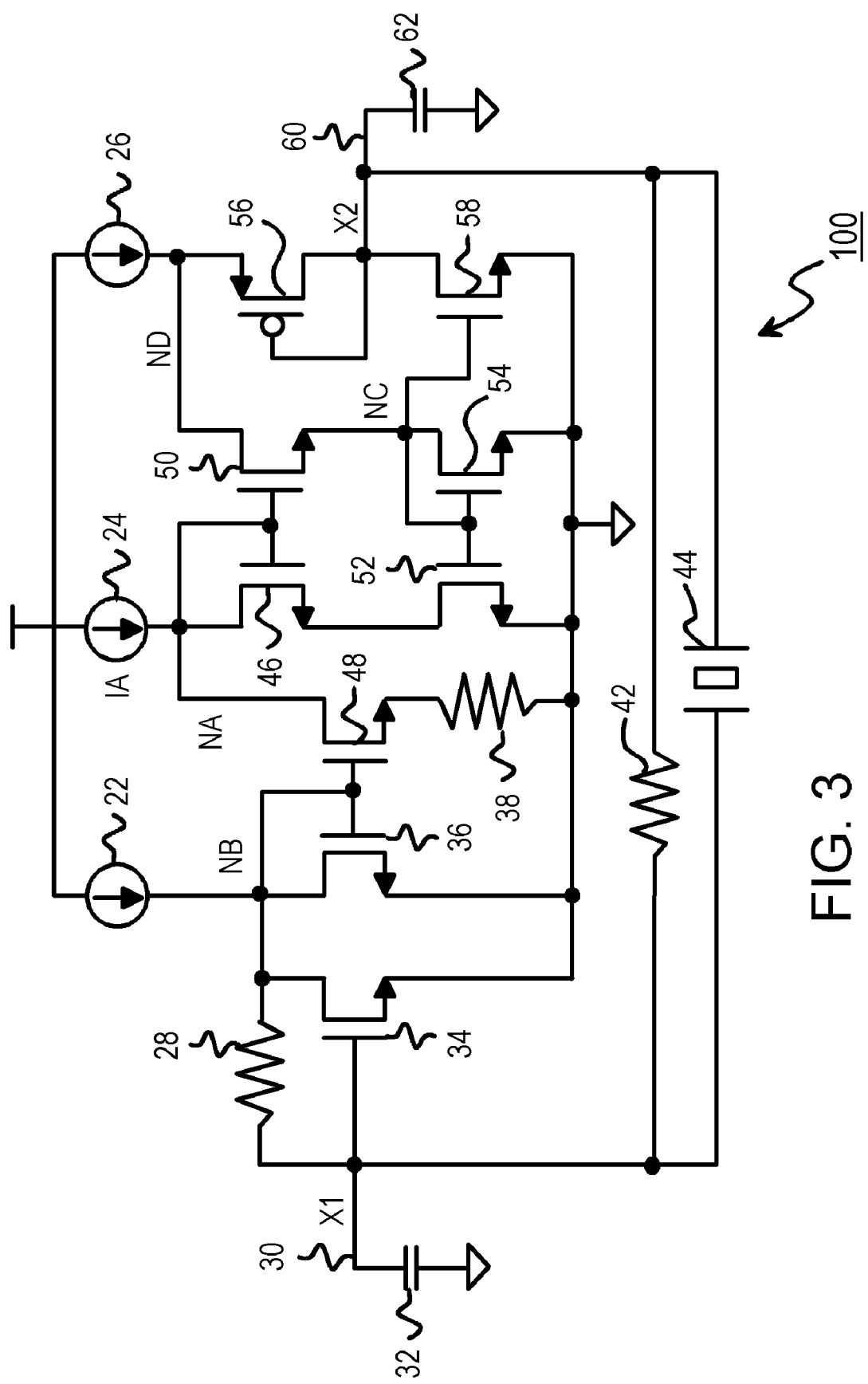
FIG. 3 is a schematic of a current-mirrored oscillator circuit without internal feedback in the inverter.

FIG. 3 is a schematic of a current-mirrored oscillator circuit without internal feedback in the inverter. Capacitor 32 on first crystal node 30 (X1) and capacitor 62 on second crystal node 60 (X2) can be load capacitances or can be adjusted to tune the oscillator frequency. Crystal 44 and bias resistor 42 are coupled in parallel to each other between crystal nodes X1, X2.

Resistors 28, 42 have a large value, such as 200 K-ohm, and block AC current but allow slower DC bias currents to flow. Since resistors 28, 42 act as AC open circuits, AC currents or small signals on first crystal node X1 only see the gate capacitance of input transistor 34, an n-channel transistor with its source grounded.

The high resistance of resistor 28 prevents AC signals on first crystal node X1 from passing through to the drain of input transistor 34, and to the gates of transistors 36, 48, which are connected together by buffered node NB. Buffered node NB is driven by source current from current source 22. The drain currents through input transistor 34 and through parallel transistor 36 sink current from buffered node NB. When X1 rises, input transistor 34 increases its drain current, reducing the voltage on buffered node NB, which is also the gate of parallel transistor 36, which then draws less drain current. Thus the total current through transistors 34, 36 remains relatively constant.

Transistors 34, 36 and current source 22 form the low-gain input stage. Buffered node NB is applied to the gate of converter transistor 48, which converts the voltage on buffered node NB to a current that is limited by source resistor 38 on the source of converter transistor 48.

The drain current of converter transistor 48 is pulled from amplifier node NA, which received current from current source 24. Current from amplifier node NA is sunk through upper amplifier transistor 46, which is in series with lower amplifier transistor 52. The gate and drain of upper amplifier transistor 46 are connected together at amplifier node NA and to the gate of upper current mirror transistor 50. The gate of lower amplifier transistor 52 and the gate and drain of lower current mirror transistor 54 are connected together as current-mirror node NC. The current through the channel of upper amplifier transistor 46 is mirrored to the channel current of upper current mirror transistor 50, while the current through lower current mirror transistor 54 is mirrored to lower amplifier transistor 52.

Current-mirror node NC drives the gate of output transistor 58, which drains current to ground from second crystal node X2, the output node of circuit 100. Pull-up current to second crystal node X2 is provided by current source 26 and p-channel transistor 56 in series. The gate and drain of p-channel transistor 56 are connected together at node X2.

The drain of upper current mirror transistor 50, drain node ND, is connected to current source 26 and to the source of p-channel transistor 56. Thus the current-mirror and output-stage current is provided by current source 26, while the voltage-to-current and gain stage current is provided by current source 24. Current source 22 provides current to the input stage. Current sources 22, 24, 26 could each be a transistor with a gate driven by a bias voltage. The bias voltage could be generated by a band-gap reference generator or another reference so as to be relatively independent of supply, temperature, and process variations.

The amplifier current IA through current source 24 can be relatively small to limit voltage swings. Larger AC signals input to first crystal node X1 can result in clipped voltages on second crystal node X2 due to the limited current from current source 24, which limits voltage swings on current-mirror node NC and drain node ND. The large-signal gain is limited to IA/V(X1) when clipping occurs. Larger AC voltages produce reduced gain. Once gain is reduced to the value of the positive resistance of the crystal, the AC input voltage stops increasing.

Both p-channel transistor 56 and output transistor 58 can operate in the saturated region, resulting in an approximately sine-wave output signal on second crystal node X2. The output impedance of p-channel transistor 56 and output transistor 58 is relatively high, not degrading the Q value of the crystal. Internal nodes can be kept at low impedance to reduce phase shift.

Operation

When X1 rises, input transistor 34 increases its drain current, reducing the voltage on buffered node NB, which is also the gate of parallel transistor 36, which then draws less drain current. Thus the total current through transistors 34, 36 remains relatively constant as buffered node NB falls in voltage.

The lower voltage on buffered node NB is applied to the gate of converter transistor 48, which reduces its drain current. The lower drain current from amplifier node NA shifts more of amplifier current IA through upper amplifier transistor 46 and lower amplifier transistor 52, raising the voltage of amplifier node NA and increasing mirrored current in upper current mirror transistor 50. The higher current through upper current mirror transistor 50 decreases the pull-up current through p-channel transistor 56, helping second crystal node X2 to fall in voltage.

The larger current through upper current mirror transistor 50 must pass through lower current mirror transistor 54, causing its gate voltage, current-mirror node NC, to rise. The higher voltage on current-mirror node NC is applied to the gate of output transistor 58, increasing the pull-down current from second crystal node X2. Thus the voltage of second crystal node X2 falls when X1 rises. Falling X1 voltages produces opposite changes, ultimately resulting in X2 rising in voltage. Thus circuit 100 acts as an inverter.

All substrates of n-channel transistors 34, 36, 46, 48, 50, 52, 54, 58 can be formed in the same P-well or p-substrate and can be tied to ground or to a back-bias voltage below ground. The bulk node of p-channel transistor 56 can be connected to its source, drain node ND.

ALTERNATE EMBODIMENTS

Several other embodiments are contemplated by the inventors. For example, capacitors, resistors, and other components may be added, and parasitic components may exist. The standard transistor layout does not have to be used for the capacitors, but other layouts such as doughnut rings or large rectangles with source/drain on 3 sides could be employed. Various improvements in complementary metal-oxide-semiconductor (CMOS) technology and transistors may be employed. Currents, current sources and current sinks can be positive or negative, depending on direction. For example, a negative current source can sink current, such as to ground. Signals, logic, and transistors can be complemented or inverted in a variety of ways. Sources and drains of transistors are often interchangeable.

The voltage range of X1, X2, and other nodes could be adjusted or shifted. The crystal nodes X1, X2 could each have both n-channel and p-channel capacitors connected in parallel to adjust oscillator frequency.

The transistor sources could terminate at a voltage other than ground, or tail resistors could be added. The same is true for the current sources, which could be terminated at a voltage other than the power-supply voltage.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. An oscillator inverter circuit comprising:
   a first crystal node and a second crystal node that are for coupling across a crystal oscillator;

a plurality of current sources generating source currents that are relatively insensitive to changes in a power-supply voltage including an amplifier source current and an output source current;

a low-gain input stage having a gate on the first crystal node and outputting a buffered node buffered from the first crystal node;

a gain stage having a converter transistor that receives the buffered node on a gate and generates a varying current that varies with voltage variations of the first crystal node;

a current mirror that receives a current difference of the amplifier source current and the varying current, the current mirror generating a mirrored voltage by mirroring the current difference; and an output stage that receives the output source current and the mirrored voltage, with an output transistor that has a gate driven by the mirrored voltage and is connected to the second crystal node, whereby the varying current is mirrored by the current mirror to control driving of the second crystal node by the output stage.

2. The oscillator inverter circuit of claim 1 wherein the low-gain input stage further comprises:

an input resistor coupled between the first crystal node and the buffered node, the input resistor having a resistance sufficient to block oscillating signals from the crystal oscillator, but passing bias voltages.

3. The oscillator inverter circuit of claim 2 wherein the input resistor has a resistance of at least 200 K-ohms.

4. The oscillator inverter circuit of claim 2 wherein the current mirror comprises:

a combining node that combines the amplifier source current and the varying current to generate the current difference;

an amplifier transistor that passes the current difference through a channel, and has a gate connected to the combining node;

a first mirror transistor having a gate connected to the combining node, for generating a mirrored current; and a second mirror transistor having a channel in series with a channel of the first mirror transistor, the second mirror transistor having a gate and a drain connected together to generate the mirrored voltage.

5. The oscillator inverter circuit of claim 4 wherein the output stage further comprises:

a pull-up transistor that receives a first portion of the output source current, the first portion being conducted by a channel of the pull-up transistor to the second crystal node;

wherein a second portion of the output source current is received by the first mirror transistor.

6. The oscillator inverter circuit of claim 1 wherein the low-gain input stage comprises an input transistor having a drain connected to the buffered node and a gate connected to the first crystal node;

wherein the buffered node receives an input source current from the plurality of current sources;

wherein the converter transistor is a n-channel transistor that receives the buffered node on a gate and a drain at a combining node and a grounded source;

wherein the combining node receives the amplifier source current;

an upper amplifier transistor in the current mirror, having a drain connected to the combining node, a gate connected to the combining node, and a source connected to an intermediate node;

a lower amplifier transistor in the current mirror, having a drain connected to the intermediate node, a gate connected to the mirrored voltage, and a source connected to a ground;

an upper current mirror transistor having a drain connected to an output-source node receiving the output source current, a gate connected to the combining node, and a source connected to the mirrored voltage;

a lower current mirror transistor in the current mirror, having a drain connected to the mirrored voltage, a gate connected to the mirrored voltage, and a source connected to the ground;

wherein the output transistor has a drain connected to the first crystal node and a source connected to the ground.

7. A current-mirrored crystal oscillator comprising:

a crystal, coupled between a first node and a second node, that oscillates at an oscillation frequency when connected to a gain inverter;

a bias resistor coupled between the first and second nodes, for biasing the first and second nodes to an intermediate voltage;

a gain inverter, having an input driven by the first node, for driving the second node to induce oscillation by the crystal, wherein the gain inverter comprises:

an input transistor having a gate connected to the first node and a drain driving a buffered node;

a converter transistor having a gate connected to the buffered node, for generating a varying current that varies with small-signal variations on the first node;

a current mirror, coupled to mirror changes in the varying current to generate a mirrored node; and an output stage, responsive to the mirrored node, for driving an output current from the second node, whereby the small-signal variations on the first node are buffered, converted to the varying current, and mirrored to drive the output current from the second node.

8. The current-mirrored crystal oscillator of claim 7 wherein the current mirror comprises:

a first amplifier transistor having a gate connected to the mirrored node, and receiving an amplifier current that varies with the varying current; and a first current mirror transistor having a gate and a drain connected to the mirrored node, for biasing the mirrored node.

9. The current-mirrored crystal oscillator of claim 8 wherein the current mirror further comprises:

an amplifier node connected to receive the varying current from the converter transistor;

a second amplifier transistor having a gate and a drain connected to the amplifier node, the second amplifier transistor having a channel in series with a channel of the first amplifier transistor; and a second current mirror transistor having a gate connected to the amplifier node, the second current mirror transistor having a channel in series with a channel of the first current mirror transistor.

10. The current-mirrored crystal oscillator of claim 9 wherein the output stage comprises:

an output transistor having a gate connected to the mirrored node and a drain connected to the second node;

a pull-up transistor having a gate and a drain connected to the second node, and a source connected to the channel of the second current mirror transistor.

11. The current-mirrored crystal oscillator of claim 10 wherein the output stage further comprises:

an output current source connected to a drain node that connects to the channel of the second current mirror transistor and connects to the source of the pull-up transistor.

12. The current-mirrored crystal oscillator of claim 11 further comprising:
a source resistor, connected between a channel of the converter transistor and a ground.

13. The current-mirrored crystal oscillator of claim 9 further comprising:
an amplifier current source, connected to the amplifier node, for sourcing current to the amplifier node and to the converter transistor and to the second amplifier transistor.

14. The current-mirrored crystal oscillator of claim 13 further comprising:
an input current source, connected to the buffered node, for sourcing current to the buffered node and to the input transistor.

15. The current-mirrored crystal oscillator of claim 8 further comprising:
a parallel transistor, having a gate and a drain connected to the buffered node, for generating a voltage of the buffered node.

16. The current-mirrored crystal oscillator of claim 8 further comprising:
an input resistor connected between the first node and the buffered node, for passing direct-current (DC) bias voltages but for blocking small-signal variations in the first node.

17. The current-mirrored crystal oscillator of claim 10 wherein the input transistor, the converter transistor, the first amplifier transistor, the first current mirror transistor, and the output transistor are n-channel transistors having sources connected to a ground.

18. The current-mirrored crystal oscillator of claim 17 wherein the pull-up transistor is a p-channel transistor.

19. A current-mirroring inverter for a crystal oscillator comprising:

input transistor means, receiving a first crystal node at a gate, for conducting a buffered current from a buffered node in response to rapid voltage variations on the first crystal node generated by oscillation of a crystal connected to the first crystal node and to a second crystal node;

converter transistor means, having a gate receiving the buffered node, for conducting a varying current from a combining node in response to the buffered node;

amplifier current source means for generating an amplifier current to the combining node;

first amplifier transistor means, having a gate driven by the combining node, for conducting a difference current from the combining node;

first current mirror transistor means, receiving the combining node at a gate, for conducting a mirrored current;

second current mirror transistor means, having a gate driven by a mirrored node between channels of the first and second current mirror transistor means, for conducting the mirrored current; and output transistor means, having a gate receiving the mirrored node, for drawing current from the second crystal node.

20. The current-mirroring inverter of claim 19 further comprising:
input resistor means for conducting slow bias voltages from the first crystal node to the buffered node, and for blocking rapid voltage variations on the first crystal node generated by oscillation of the crystal connected;

parallel transistor means, having a gate driven by the combining node, for conducting current from the combining node in parallel to the buffered current through the input transistor means.

* * * * *